(12) United States Patent
Richert et al.

(10) Patent No.: US 6,495,800 B2
(45) Date of Patent: Dec. 17, 2002

(54) CONTINUOUS-CONDUCTION WAFER BUMP REFLOW SYSTEM

(76) Inventors: Carson T. Richert, 4247 San Ramon Dr., Corona, CA (US) 91720; Luis Alejandro Rey Garcia, 682 Coolidge St., Long Beach, CA (US) 90805; Dienhung D. Phan, 15123 S. Brookhurst St. #170, Westminster, CA (US) 92683; Selina De Rose-Juarez, 26587 Colt Dr., Corona, CA (US) 92883; Andrei Szilagyi, 30917 Ganado Dr., Rancho Palos Verdes, CA (US) 90275

(*) Notice: Subject to any disclaimer, the term of this patent is extended or adjusted under 35 U.S.C. 154(b) by 0 days.

(21) Appl. No.: 09/755,812

(22) Filed: Jan. 5, 2001

(65) Prior Publication Data

US 2001/0030184 A1 Oct. 18, 2001

Related U.S. Application Data

(63) Continuation-in-part of application No. 09/645,772, filed on Aug. 23, 2000.
(60) Provisional application No. 60/150,986, filed on Aug. 23, 1999.

(51) Int. Cl.$^7$ .............................. F27B 9/24; F27B 9/36
(52) U.S. Cl. ..................... 219/388; 219/411; 219/413; 228/102; 228/180.22

(58) Field of Search .............................. 219/388, 411, 219/413; 228/102, 180.1, 180.21, 180.22

(56) References Cited

U.S. PATENT DOCUMENTS

| | | | |
|---|---|---|---|
| 2,056,207 A | 10/1936 | Piazzoli, Jr. | 49/47 |
| 2,334,865 A | 11/1943 | Crawford | 257/3 |
| 2,674,809 A | 4/1954 | Meienhofer | 34/48 |
| 2,981,819 A | 4/1961 | Gregory | 219/35 |

(List continued on next page.)

FOREIGN PATENT DOCUMENTS

| EP | 0 108 314 | | 5/1984 |
|---|---|---|---|
| JP | 4-262861 | * | 9/1992 |
| WO | WO 87/03077 | | 5/1987 |

*Primary Examiner*—Joseph Pelham
(74) *Attorney, Agent, or Firm*—Christie, Parker & Hale, LLP (57) ABSTRACT

A furnace for reflowing solder on a wafer having a heating chamber with an entrance, an exit, and top, bottom, side, and end walls formed of sheets of porous insulation. The furnace has a first belt extending from a loading position into and through the heating chamber. The furnace has a second belt coupled to the first belt, the second belt extending through the exit of the heating chamber to an unloading position. The heating chamber also has infrared lamps positioned below the first belt, the infrared lamps heat the first belt, such that the first belt heats the wafer situated on the first belt.

29 Claims, 5 Drawing Sheets

U.S. PATENT DOCUMENTS

| | | | |
|---|---|---|---|
| 3,415,503 A | 12/1968 | Beck | 263/8 |
| 3,436,524 A | 4/1969 | Pauls | 219/347 |
| 3,515,854 A | 6/1970 | Williams | 219/388 |
| 3,596,125 A | 7/1971 | Seigel | 313/22 |
| 3,603,827 A | 9/1971 | Degawa et al. | 313/24 |
| 3,619,682 A | 11/1971 | Lo et al. | 313/22 |
| 3,739,215 A | 6/1973 | Murai | 313/24 |
| 3,798,061 A | 3/1974 | Yamazaki | 117/213 |
| 3,818,181 A | 6/1974 | Benard | 219/388 |
| 3,836,751 A | 9/1974 | Anderson | 219/411 |
| 3,851,200 A | 11/1974 | Thomasson | 313/113 |
| 3,867,660 A | 2/1975 | Fohl | 313/12 |
| 3,882,596 A * | 5/1975 | Kendziora et al. | 228/102 |
| 4,000,407 A | 12/1976 | Keller et al. | 240/47 |
| 4,025,811 A | 5/1977 | Van Nes | 313/22 |
| 4,100,418 A | 7/1978 | Brown, Jr. | 250/510 |
| 4,101,424 A | 7/1978 | Schooley et al. | 250/504 |
| 4,101,759 A | 7/1978 | Anthony et al. | 219/343 |
| 4,244,285 A | 1/1981 | Baker | 99/339 |
| 4,245,613 A | 1/1981 | Wells et al. | 126/19 R |
| 4,323,810 A | 4/1982 | Horstmann | 313/24 |
| 4,389,562 A | 6/1983 | Chaudoir | 219/388 |
| 4,406,944 A | 9/1983 | Crain et al. | |
| 4,435,445 A | 3/1984 | Allred et al. | 427/54.1 |
| 4,460,821 A | 7/1984 | Crain et al. | |
| 4,477,718 A | 10/1984 | Crain et al. | |
| 4,517,448 A | 5/1985 | Crain et al. | 219/388 |
| 4,558,660 A | 12/1985 | Nishizawa et al. | 118/725 |
| 4,820,906 A | 4/1989 | Stultz | 219/405 |
| 4,833,301 A * | 5/1989 | Furtek | 219/388 |
| 4,856,458 A | 8/1989 | Yamazaki et al. | 118/722 |
| 4,876,437 A * | 10/1989 | Kondo | 219/388 |
| 4,994,705 A | 2/1991 | Linder et al. | 313/24 |
| 4,997,364 A | 3/1991 | McGrath et al. | |
| 5,008,593 A | 4/1991 | Schlie et al. | 315/39 |
| 5,094,010 A | 3/1992 | Jacobi et al. | 34/1 R |
| 5,147,130 A | 9/1992 | Watanuki | 362/218 |
| 5,259,546 A * | 11/1993 | Volk | 228/102 |
| 5,325,601 A | 7/1994 | Brownewell et al. | 34/247 |
| 5,340,089 A | 8/1994 | Heath et al. | 266/87 |
| 5,372,781 A | 12/1994 | Hallett et al. | 422/186.3 |
| 5,387,546 A | 2/1995 | Maeda et al. | 437/174 |
| 5,481,087 A * | 1/1996 | Willemen | 219/388 |
| 5,504,666 A | 4/1996 | Carmichael | 362/294 |
| 5,505,912 A | 4/1996 | Hallett | 422/186.3 |
| 5,607,609 A * | 3/1997 | Sakuyama et al. | 219/388 |
| 5,840,600 A | 11/1998 | Yamazaki et al. | 438/151 |
| 5,864,119 A | 1/1999 | Vogt et al. | |
| 5,970,384 A | 10/1999 | Yamazaki et al. | 438/795 |
| 6,018,144 A | 1/2000 | Vogt et al. | |

\* cited by examiner

CONTINUOUS-CONDUCTION WAFER BUMP REFLOW SYSTEM

CROSS-REFERENCE TO RELATED APPLICATION

This application is a continuation-in-part of U.S. application Ser. No. 09/645,772, filed on Aug. 23, 2000, which claims priority of provisional patent application No. 60/150,986 filed on Aug. 23, 1999, the entire contents of which are hereby incorporated by reference.

BACKGROUND

"Wafer bumping" refers to a semiconductor packaging technology that prepares microchips for flip chip attachment onto an integrated circuit package or other electronic assembly. There are numerous different methods of wafer bumping, but the process typically involves placing tiny amounts of electrically conductive material onto the input/output pads of a wafer and then subjecting the wafer assembly with the electrically conductive material to a thermal process known as mass solder reflow. Controlling the wafer temperature is critically important to allow the solder to reflow while at the same time preventing damage to the wafer.

One prior art method of performing a solder reflow process is known in the industry as hot-plate technology. Hot-plate technology utilizes conduction, where the wafer is placed on a flat thermal mass precisely maintained at a given temperature. Conduction heating of the type employed in hot-plate technology is beneficial because the temperature of the wafer will not go higher than the temperature of the thermal mass (hot-plate) on which the wafer is sitting. Traditionally, hot-plate technology requires a system having multiple isolated hot plate stages and a means of moving the wafer to be reflowed from stage to stage to achieve proper heating.

There are several disadvantages to the prior art hot-plate type reflow system. First, because of their thermal mass, hot plates are slow to heat up and to cool down. Therefore, a lot of production time is lost when it is necessary to change set point temperature for a high temperature solder alloy to a lower temperature for a low temperature solder. Second, a pusher bar is typically used to push wafers from stage to stage. Spacing between pusher bars are established for a particular sized wafer, for example, eight-inch and twelve-inch wafers, etc. If the equipment is used with smaller wafers than it was designed for, production capacity is lost. Third, fluxes residues are formed from the wafers as they are heated, and the fluxes residues accumulate on plate surfaces. One source of flux is an organic acid that is put on a wafer to provide viscosity and to remove oxides on metal surface that inhibit good electrical connections. When passing through the various hot plates, the wafers get dirty from being pushed through the condensed fluxes, and have to be cleaned in an additional, costly step.

Fourth, commercially available hot plate equipment does not provide a controlled atmosphere surrounding the reflow and cooling areas that is capable of maintaining an inert atmosphere or reactive gas atmosphere that contains less than five parts per million oxygen molecules, and so allowing oxidation to occur. Fifth, the gas that is used in the prior art systems to control atmosphere causes wafer movement which makes in line processing using cassette to cassette loading equipment more difficult to use. Sixth, the condensed fluxes must frequently be manually removed from numerous parts of the hot-plate equipment causing significant lost production time and considerable expense.

SUMMARY OF THE INVENTION

The present invention is directed to a furnace for reflowing solder on a microchip. The furnace has a heating chamber with top, bottom, side, and end walls formed of sheets of porous insulation. The heating chamber has an entrance and an exit.

A first belt extends from a loading position through the heating chamber. A second belt is coupled to the first belt, the second belt extending through the exit of the heating chamber to an unloading position.

Within the heating chamber, below the first belt, infrared lamps are positioned. The infrared lamps heat the first belt, such that the first belt heats a microchip situated on the second belt.

In another embodiment the furnace has a housing with walls defining a heating chamber disposed between an entrance and an exit. Each wall of the housing includes a porous insulative inner panel and a non-porous outer panel.

The first conveyor moves an object from the loading position through the entrance of the heating chamber and through the heating chamber between the entrance and the exit. The second conveyor moves the object from the first conveyor through the exit of the heating chamber to an unloading position.

In an embodiment, the furnace has a pressurized gas inlet between the inner and outer panels to induce gas flow through the inner panel to the heating chamber. An area below the first conveyor is divided into stages transverse to the first conveyor. Each stage has at least one infrared lamp to heat the first conveyor.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION

Figure 1:
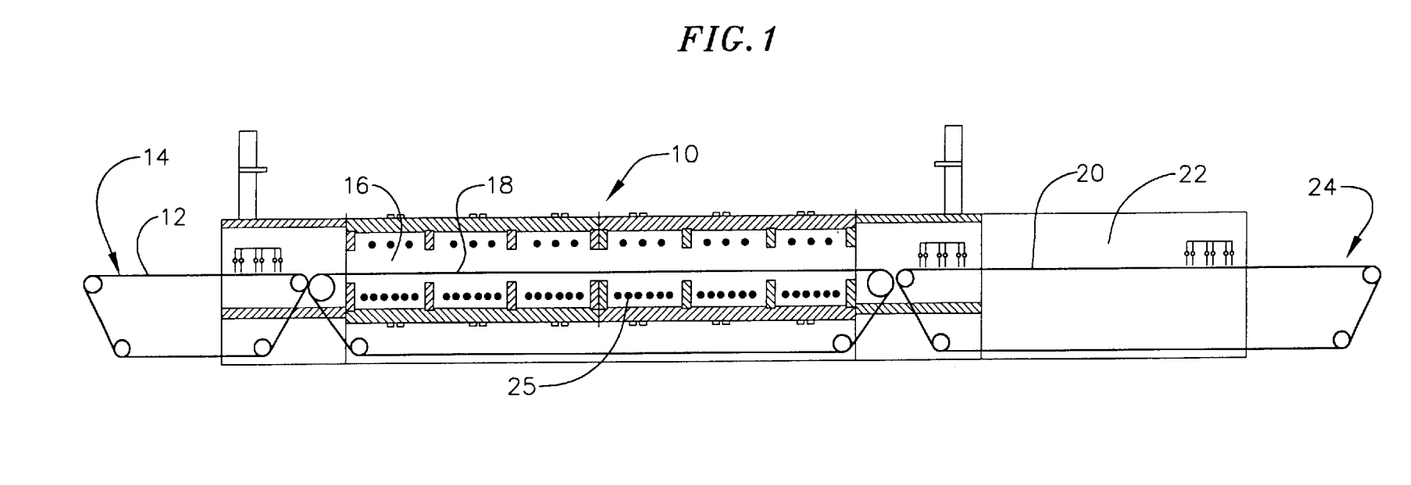
FIG. 1 is a side cross-sectional overview of a continuous-conduction wafer bump reflow system according to an embodiment of the current invention.

FIG. 1 shows an overview of a wafer bump reflow furnace 10 according to one embodiment of the present invention. The furnace utilizes three separate conveyer belts to transport wafers through the furnace 10. A loading belt 12 transports wafers from a loading station 14 through a baffle into a heating chamber 16 having a controlled atmosphere. A hot belt 18 transports wafers through the heating chamber 16, where the reflow process occurs. While transporting the wafer through the heating chamber 16, the hot belt 18 acts as a moving hot plate heating the wafer through conduction. The temperature of the hot belt 18 changes as the hot belt passes through different stages in the heating chamber 16. A cooling belt 20 receives each wafer from the hot belt, and moves the wafer through a cooling area 22 still within a controlled atmosphere, thus immediately cooling the wafer. The cooling 20 belt transports the wafer through a baffle back into room atmosphere to an unloading station 24 where the wafer is removed from the cooling belt.

In one embodiment of the present invention, the basic structure of the furnace is consistent with that described in U.S. Pat. No. 4,517,448 to Crain et al., the contents of which are incorporated herein by reference. In an embodiment, the furnace has a pedestal upon which is provided a lower framework having access doors. Mounted on the top of the lower framework, inwardly from the ends thereof, is a shorter upper framework. The enclosure for the upper framework is also provided with access doors. A heating chamber is supported within the lower and upper frameworks.

Mounted within the pedestal is a computer which allows a user to program the temperature in different zones along a length of the heating chamber. The computer is electrically connected to a digital controller, also located within the pedestal, that monitors and controls the temperature in the different zones along the length of the heating chamber. Also mounted in the pedestal is an electric fan for drawing cooling air entering an opening in the pedestal, past electronic power circuits enclosed therein. Mounted on the top of the upper framework is a display screen for data entry and display.

The heating chamber is an elongated rectangularly shaped enclosure having its upper and lower walls constructed of sheets of insulation, and having its side walls constructed of sheets of insulation. The heating chamber 16 is divided by the hot belt 18 and insulation surrounding the hot belt. The hot belt 18 is supported to ride within the heating chamber on three quartz tubes which extend throughout the length of the heating camber and rest on three semicircular grooves provided on the end walls. The sheets of insulation are formed by compressing a heat insulating material such as a white alumina fiber so that it forms a porous structural wall having a relatively smooth surface. An upper plenum chamber is formed between the top of the heating chamber and the top of the upper rectangular framework. In an additional embodiment, a lower plenum chamber is formed between the bottom of the heating chamber and the bottom of the lower rectangular framework.

A cover gas which may be nitrogen or hydrogen for example, may be fed under a low pressure to the plenum chamber above the heating chamber 16. A system for administering a cover gas to the system is described in U.S. Pat. No. 4,517,448. In this system, the cover gas slowly and evenly filters through the porous sheets of insulation which form the top and bottom walls of, the heating chamber 16, thus causing the interior of the heating chamber to be at a slightly higher pressure than the atmosphere surrounding the infrared furnace. The increased pressure in the heating chamber 16 keeps unwanted air from entering the heating chamber and causing unwanted reactions.

Each of the side walls of the heating chamber is provided with circular holes both above and below the heating belt. A plurality of elongated infrared lamps 25 are mounted within the circular holes. A mounting for the infrared lamps 25 is disclosed in U.S. Pat. No. 4,517,448. Other types of lamps, using other wavelengths of light for example, may be employed to heat the hot belt 18 as it passes over. Each lamp is located either above or below the heating belt, and the lamps below the belt can be operated independently of the lamps above the belt.

As will be explained later, the infrared lamps located below the hot belt 18 are used to heat the hot belt 18 and the wafer resting on top of the hot belt 18 to a desired temperature. The infrared lamps 25 located above the hot belt 18 are used to greatly elevate the temperature of the hot belt 18, when no wafers are being treated, to burn off any fluxes residues, thus performing a self-cleaning function.

Additional pieces of insulation are affixed below the hot belt 18 perpendicular to the direction of belt travel at preselected intervals to create isolated stages. Each isolated stage has infrared lamps that are controlled to heat the hot belt to a preset temperature.

Figure 2:
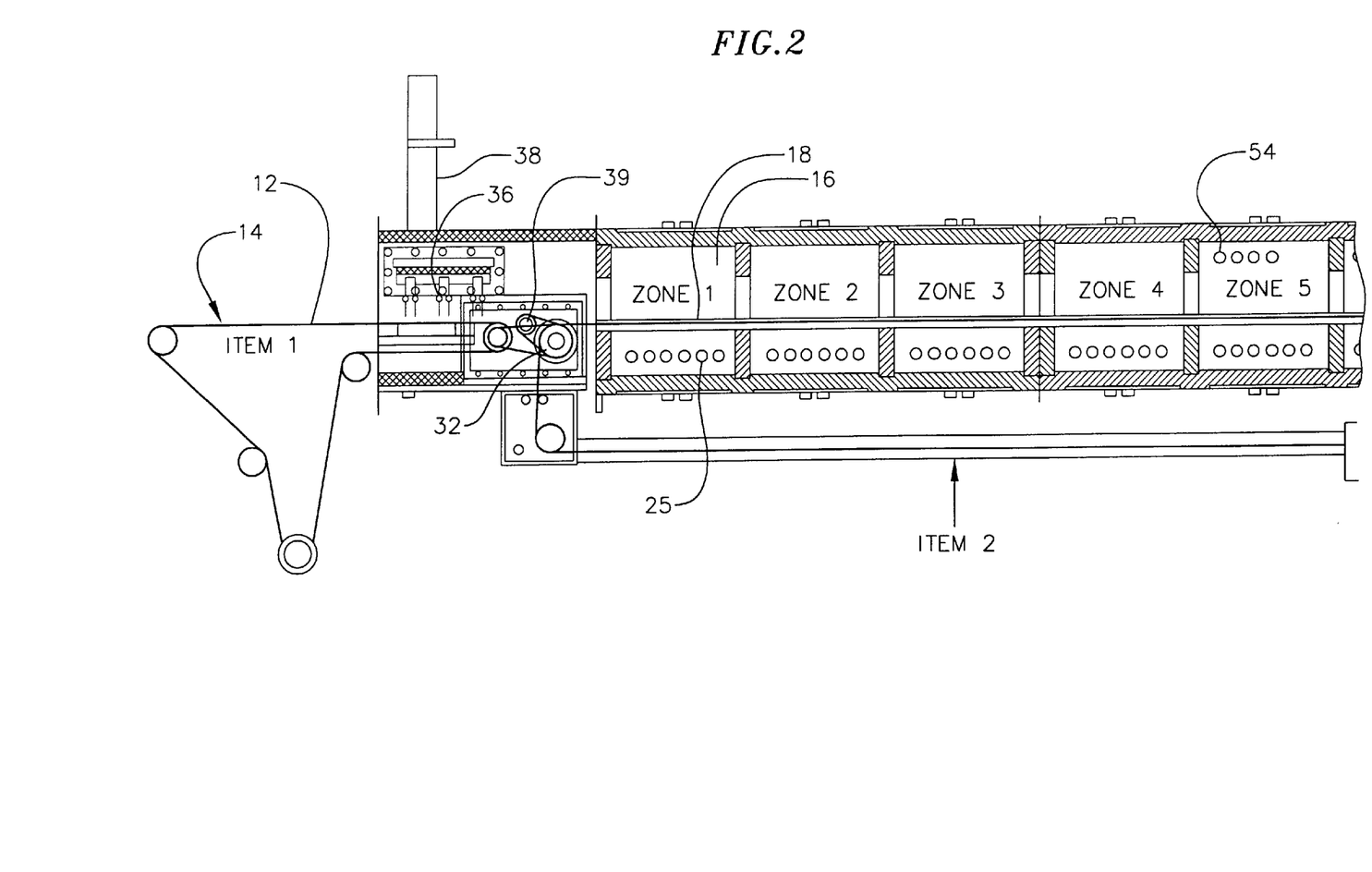
FIG. 2 is a side cross-sectional view of a first half of a continuous-conduction wafer bump reflow system according to an embodiment of the current invention.
Figure 3:
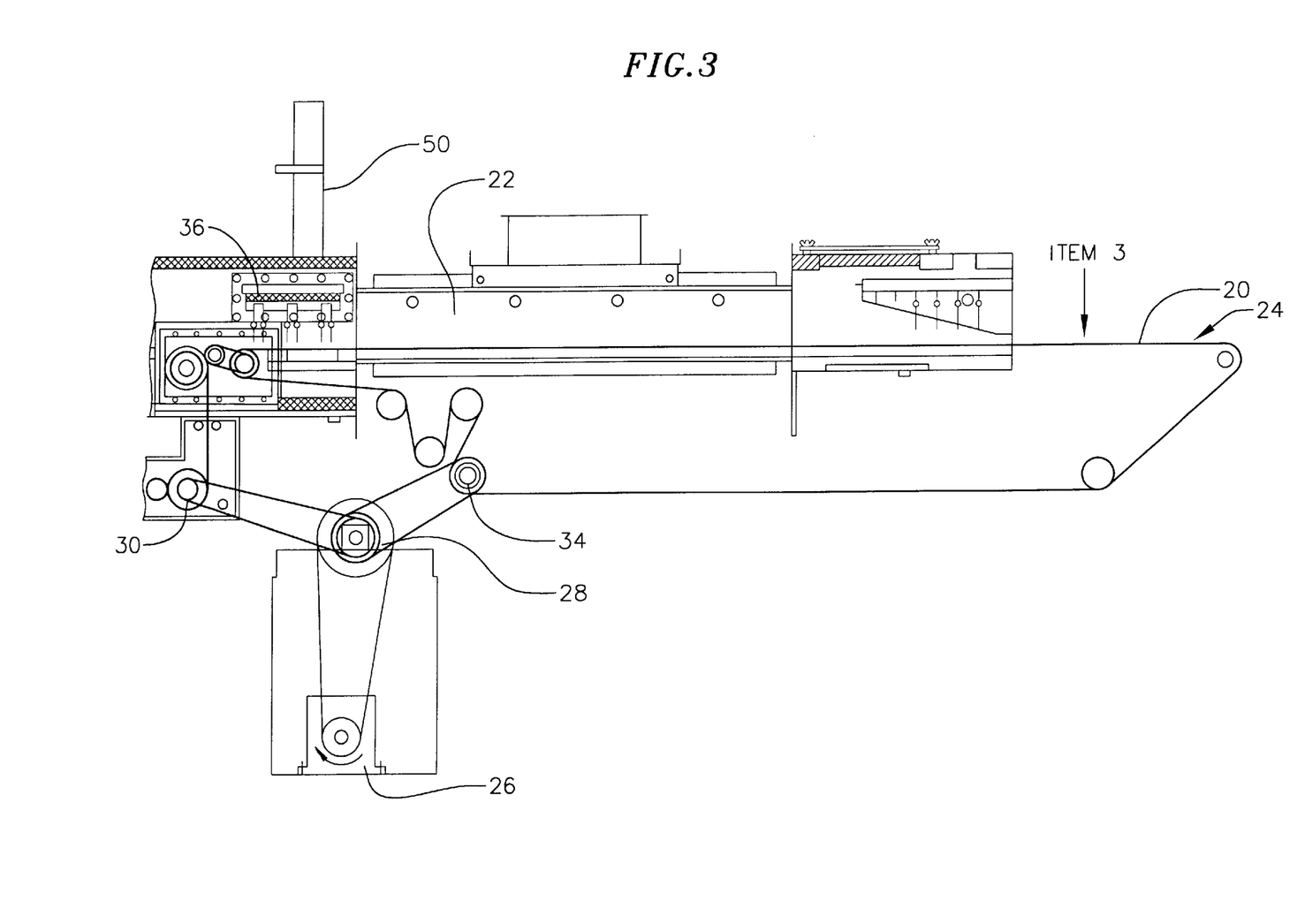
FIG. 3 is a side cross-sectional view of a second half of a continuous-conduction wafer bump reflow system according to an embodiment of the current invention.

FIGS. 2 and 3 show the furnace in more detail. All three belts are coupled to a motor 26. The motor 26 is coupled to a first pulley 28 that in turn is coupled a hot belt pulley 30. The hot belt 18 is coupled to the hot belt pulley 30 and turns a loading belt pulley 32. The loading belt pulley 32 turns the loading belt 12. The first pulley 28 is also coupled to a cooling belt pulley 34. The cooling belt pulley 34 turns the cooling belt 20.

FIG. 2 shows the loading Station 14 and the loading belt 12 in more detail. In one embodiment of the present invention, the loading belt is made of a loose weave stainless steel. As shown in FIG. 2, the loading belt 12 passes into the heating chamber 16. The loading belt 12 is approximately 30 inches long with one end in the loading station 14. In one embodiment, wafers are loaded onto the loading belt 12 by hand. In an alternative embodiment of the present invention, wafers are loaded automatically. In an embodiment of the present invention, the wafers are stored in a cassette, such as the IX111 Indexer made by Mantis Robotics Corporation and are automatically loaded onto the loading belt 12 individually at set intervals.

Once a wafer is loaded onto the loading belt 12, the wafer travels through a loading baffle 36 and enters the heating chamber 16. The loading baffle 36 keeps any room air from entering into the heating chamber 16. An exemplary baffle is described in U.S. Pat. No. 4,517,448. In one embodiment, the loading baffle 36 comprises a stationary physical barrier to prevent room atmosphere from entering the furnace. The loading baffle 36 also contains air knives that function by jetting an inert gas downward toward the loading belt 12, forming a barrier to prevent room air from entering into the tunnel. In an additional embodiment there are air knives oriented upward that jet an inert gas upward toward the loading belt 12.

Also in the loading portion of the heat chamber 16 is an exhaust duct and chimney 38. An exemplary exhaust duct and chimney 38 is described in U.S. Pat. No. 4,517,448. In an embodiment of the present invention, an upward draft is created in the exhaust chimney by blowing a gas upward and out of the top of the exhaust chimney. The blowing of a gas upward and out of the exhaust chimney creates suction to draw exhaust gasses from the heating chamber and send these exhaust gasses out of the exhaust chimney. As some of the gas from the heating chamber reaches the exhaust duct and chimney, the gas is cooled and waste products in the gas condense out onto the walls of the exhaust duct and chimney.

Below the chimney is a plate 27 that collects the drippings of the exhaust gasses that condense at the bottom of the exhaust chimney. The plate 27 may be removed for cleaning by removing an outer panel of the upper frame. The use of a controlled atmosphere and an exhaust chimney prevents oxidation and removes the fluxes that evaporate off of the wafer during the reflow process. The controlled atmosphere may comprise for example, nitrogen or hydrogen. In an alternative embodiment, the controlled atmosphere comprises clean, dry air ("CDA").

After passing through the loading baffle 36 and beyond the drip plate 27, the loading belt terminates and the hot belt 18 begins. In an embodiment of the present invention an idler bar 39 assists the wafer from the loading belt 12 to the hot belt 18. Although the gap between the belts may be made quite small, the idler bar 39 ensures a smooth transition between belts for treating particularly small wafers or chips. Typically, the idler bar 39 turns at a rate equal to or greater than the speed of the loading and hot belts, and is turned using a pulley system that is turned by one of belts. The idler bar 39 prevents the end of relatively small wafers from dipping and being damaged as the wafers reach the end of the loading belt.

Figure 4:
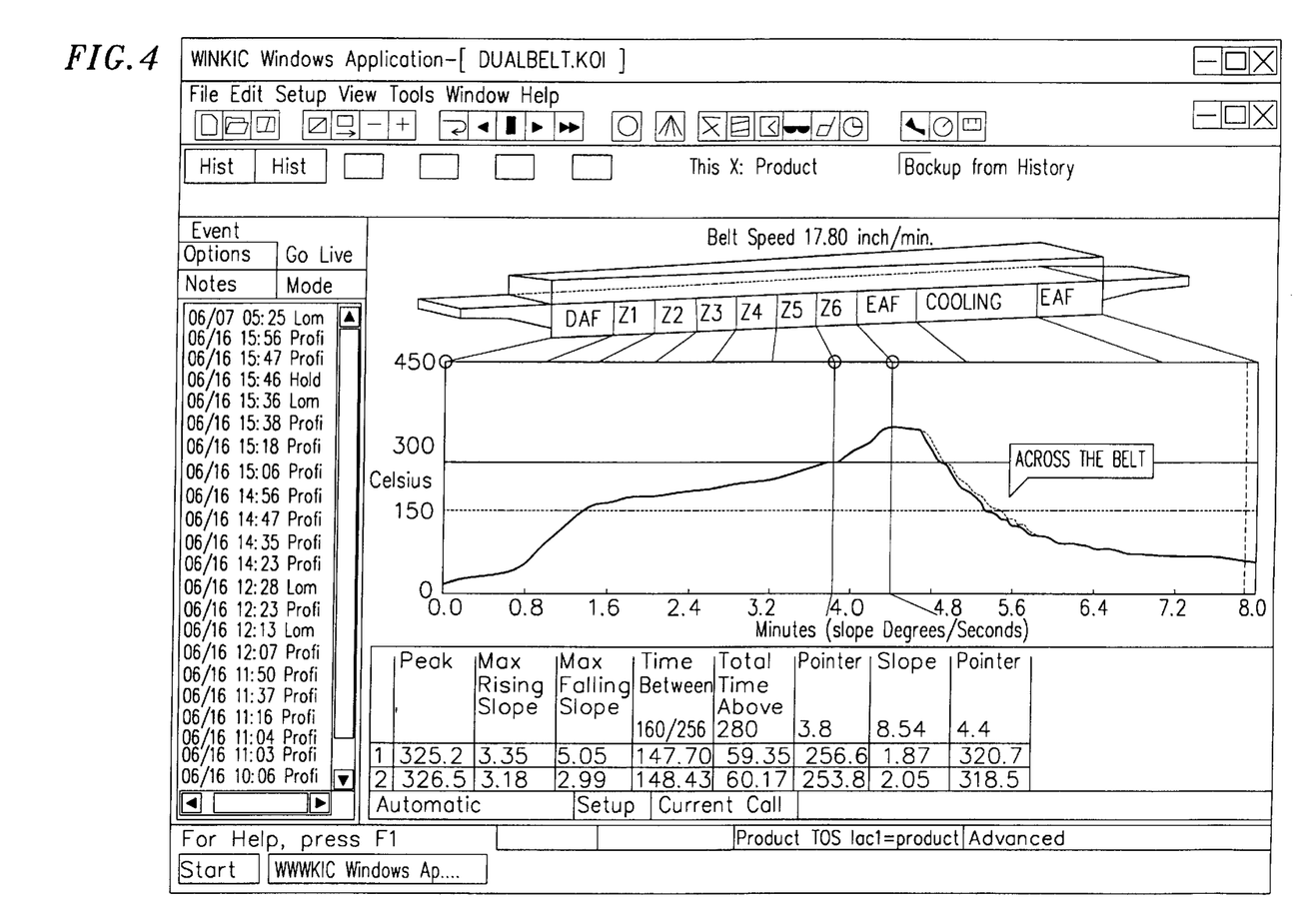
FIG. 4 is a screen shot from the computer of one embodiment of the present invention showing a reflow heating profile.

In an embodiment of the present invention, the hot belt 18 is made of a tight weave stainless steel. As shown in FIG. 2, the hot belt, and the wafer riding on top of it, travels through a staged heating chamber 16 to carry out a solder reflow process. A typical solder reflow process, as shown in FIG. 4, involves three steps. First, there is an initial ramp step where the temperature of the wafer is slowly raised to drive out moisture and activate chemical reduction processes in the solder. Next, there is an intermediate soak step to homogenize the temperature distribution across the wafer. And finally, there is a "spike" step where the temperature of the wafer is quickly raised slightly above the melting point of the solder and then immediately allowed to cool.

The heating chamber 16 is divided up into stages to accommodate a profiled heating process such as a solder reflow process. The heating chamber 16 may be made as long as desired, and can be divided into as many stages as desired. In one embodiment, the heating chamber 16 is divided up into 6 different stages. Each stage has a segmented off area containing infrared lamps that heat only the portion of the hot belt that is traveling through the stage. Each stage is insulated from other stages and from the area of the furnace above the belt, so that the heating is isolated to the specific stage, and so that as little stray infrared light as possible reflects onto the wafer and imparts heat. The direct light from the heat lamps and the light reflected off the insulation contained below the hot belt 18 in the stage heats the portion of the hot belt 18 passing over the stage up to a specific predefined temperature.

Figure 5:
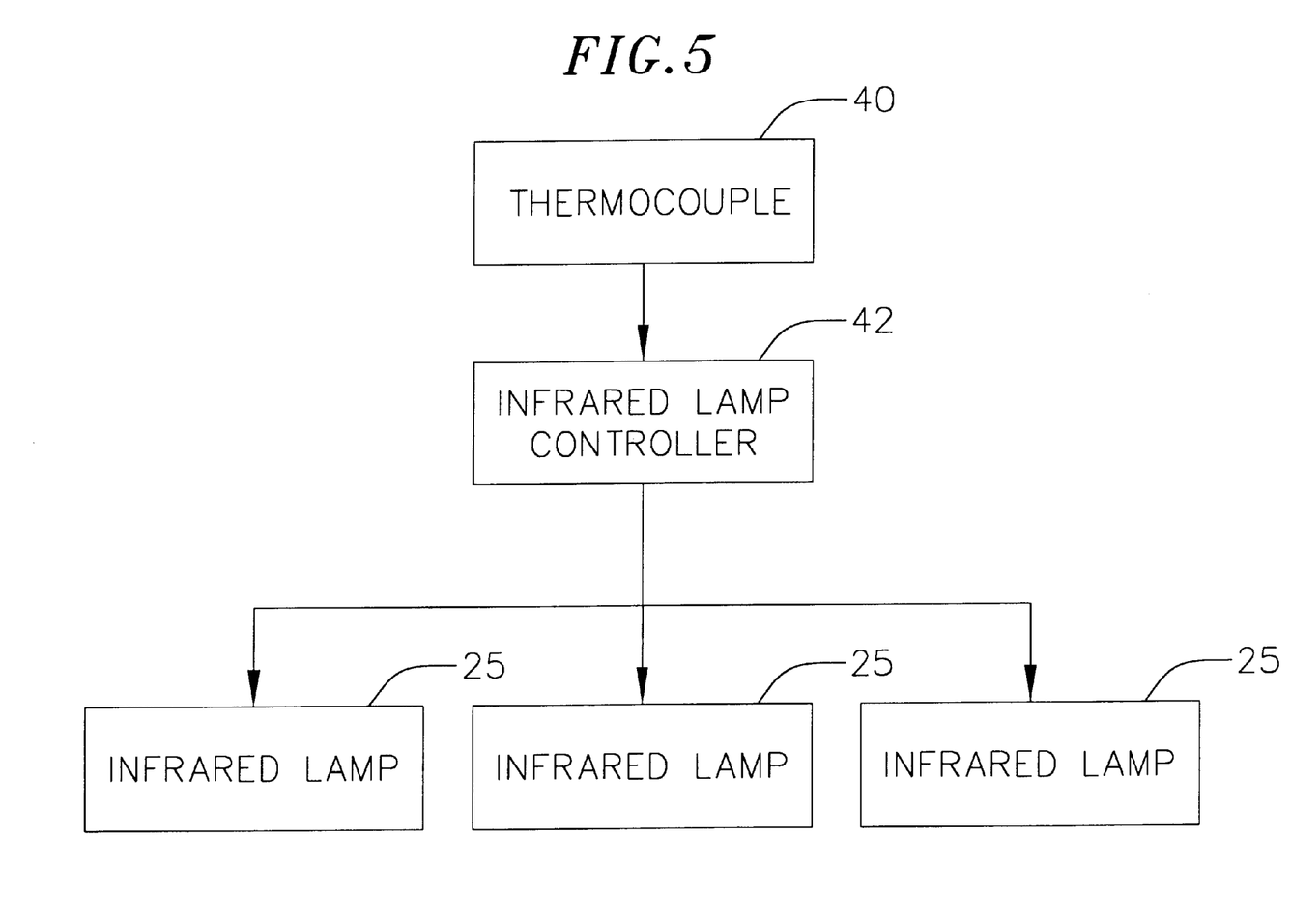
FIG. 5 is a flow diagram showing the relationship of the thermocouple to the infrared lamp control.

The infrared lamps of each stage are preset to different strengths in order to heat the portion of the hot belt to different temperatures as the portion of the hot belt passes through each stage, thus enabling the furnace to create an optimum reflow profile. As shown in FIG. 5, a thermocouple 40 is provided in each stage to get an accurate reading of the temperature of the hot belt 18 within the stage. In one embodiment of the present invention, a thermocouple consists of two wires made of different materials that produce different electromotive forces when heated. Both wires are connected to a piece of copper. The piece of copper is positioned in a fixed location to be in constant contact with the belt as the belt moves past the piece of copper. As the belt heats the copper, the copper heats the two wires of different materials, thus producing different electric potentials in each of the two wires. The measurable difference in potential is proportional to the temperature of the belt. A thermocouple 40 is connected to a digital controller 42 that alters the intensity of the infrared lamps in a given stage to achieve the desired temperatures as programmed by a user.

The number of stages may be altered depending on the heating profile desired which is in turn based upon the characteristics of the item being treated. As shown in FIG. 4, a user may manipulate the heating profile using software executing on the system's computer. In one embodiment, the software allows a user to preprogram the temperature at each stage of the heating chamber using a data input device such as a keyboard or a mouse. In an additional embodiment of the present invention, the user may also manipulate the speed of the hot belt to alter the amount of time that the wafer spends in each stage to further alter the heating profile. In another alternative embodiment, the user can manipulate the speed of each of the three belts independently of the other two.

Once the user has selected the desired temperatures in each stage and the speed of the belts, the computer software communicates the settings to the digital controller 42. In one embodiment, the digital controller 42, which is housed in the pedestal, is an Opto 22 digital control system with a temperature control system. The digital controller 42 constantly compares the actual temperature in each stage, as determined by a thermocouple, to the preset temperature and alters the power to the infrared lamps in each stage accordingly. In one embodiment of the present invention, the digital controller alters the power to the infrared lamps through a silicon controlled rectifier ("SCR")

Once the temperature and belt speed settings have been communicated to the digital controller, a user may run a test on the system by attaching one or more traveling thermocouples to a wafer that is being run through the system. The one or more traveling thermocouples communicate the temperature of the wafer at a given a given point in time. A program, such as the KIC Prophet System, samples the temperature as determined by the one or more traveling thermocouples at numerous times as the wafer passes through the heating chamber and then produces a graph of the temperature of the wafer corresponding to time. By looking at the generated graph, which is displayed on the display screen, an operator can determine whether the heating profile that actually occurs within the system is desirable and can make any necessary adjustments to the temperatures in the various stages or to the belt speed.

Different heating profiles may be desirable depending on the solder being used. For example, some solders are classified as "high temperature" solders. Typically, "high temperature" solders comprise about 95% tin and about 5% lead, and melt at approximately 330° C. Some solders are classified as "low temperature" solders. "Low temperature" solders typically comprise about 63% lead and about 37% lead, and melt at approximately 183° C. Eutectic solders are often used because they retain their hardness until they reach their exact melting temperature and therefore, their behavior can be predicted accurately.

It is important to have gradual heating, because if the wafer is heated too rapidly, the solder paste could erupt from steam formed by evaporating moisture inside of the paste. In a typical heating profile for low temperature solder, the wafer is heated at a maximum rate of about 1 to 2° C. per second, up until about 170° C. when equilibrium is allowed to occur. From about 170° C. the temperature is quickly elevated above the melting temperature of the solder by moving the second conveyor belt through appropriate heated stages. The wafer is kept at the elevated melting temperature for a given period of time, for e.g. 30 seconds, and then transferred to the cooling belt 20, where the wafer immediately cools to below the melting temperature.

As shown in FIG. 4, the heating of the hot belt becomes most intense near the end of the heating chamber to form a spike. The goal of the spike is to have the temperature of the hot belt and the wafer on top of the belt reach the optimum reflow temperature (and no higher) for the optimal period of time. The speed of the hot belt is also adjustable depending on the type of solder being used and the size of the wafer and chips being treated. In one embodiment of the present invention, the reflow temperature is reached just as the hot belt approaches a cooling belt.

In an embodiment of the present invention, all three conveyor belts are made of stainless steel. Stainless steel is a relatively poor conductor of heat. In addition, because the belt is not a solid piece of material, but rather a mesh, when one area of the second conveyor belt passes over a heating stage with an elevated temperature, the heated portion of the hot belt 18 does not conduct heat back into the portion of the hot belt 18 located over the cooler stages. The conveyor belts may also be made of other materials that have heating characteristics similar to stainless steel.

The hot belt 18 is coupled to the cooling belt 20 at the end of the heating chamber 16. In an embodiment a second idler bar 39 aids in the transition from the hot belt 18 to the cooling belt 20. The second idler bar 39 functions the same as the idler bar 39 between the loading belt 12 and the hot belt 18 described above. Although the gap between the hot belt 18 and the cooling belt 20 can be made small, the idler bar 39 is particularly helpful when the wafers or chips to be manipulated are small.

The cooling belt 20 is maintained at a cool temperature, so that once on the cooling belt the wafer is immediately brought below the reflow temperature and the reflow terminated. The cooling belt 20 is a relatively loose weave which further aids in the cooling process. In one embodiment of the present invention, the cooling process is aided by the presence of cooling gasses that are added through injectors located in the cooling area of the furnace.

The cooling belt 20 passes through an unloading air baffle 50 which serves to seal off the tunnel from room air on the exiting side of the furnace in the same way as the loading baffle 30 on the entrance side. In an embodiment of the present invention, the cooling portion of the furnace has an exhaust duct and chimney 38 and drip pan 27 that is constructed and functions the same as the exhaust chimney 38 and drip pan 27 in the loading area, as described above. In one embodiment of the present invention, the different exhaust chimneys are used together. In an alternative embodiment of the present invention, only one of the two chimneys is used at a time. In yet another embodiment of the present invention, the use of chimneys is alternated so that the production is halted less often for cleaning of the drip pans.

Once the wafer travels through the unloading air baffle 50 the wafer is transported to an unloading station 52. Once the wafer reaches the unloading station, the wafer can either be removed from the cooling belt 20 by hand or automatically. In one embodiment of the present invention, the wafer is automatically placed into a cassette.

In an additional embodiment of the present invention, the infrared lamps provided above the hot belt 18 are used as cleaning lamps 54. The cleaning lamps 54 function as a cleaning device for the hot belt 18. When the cleaning lamps 54 are turned on they raise the temperature of the hot belt 18 to temperatures far higher than those necessary for reflowing the solder. The very high temperatures turn any flux residue into carbonized ash that is blown out of either exhaust chimney 38.

Thus, in an embodiment of the present invention, a second belt made of a dense stainless steel mesh functions as a hot plate when heated from below by infrared lamps. Furthermore, the use of a dense stainless steel mesh allows for rapid heat up and cool down, and the belt can be heated to various predefined temperatures in defined heating stages. Thus, the need for a large thermal mass as is used in hot plate technology is eliminated. Furthermore, by using thermocouples that are in contact with the belt being heated, accurate temperature readings are obtainable.

In an additional embodiment of the present invention, a single belt is used as the loading belt and the hot belt. Wafers are loaded onto the first belt which transports the wafer from a loading station through a baffle into a heating chamber having a controlled atmosphere and then through the heating chamber where the reflow process occurs. While transporting the wafer through the heating chamber, the first belt acts as a moving hot plate heating the wafer through conduction. Following the final heating stage the wafer is transferred from the first belt to the cooling belt.

In yet another alternative embodiment of the present invention more than three belts may be used. For example, more than one hot belt may move the wafer through the different stages in the heating chamber. By using multiple belts in the heating chamber, the speeds of the various belts can be varied and therefore, the time that the wafer spends in each heating zone may be manipulated.

The preceding description has been presented with reference to the presently preferred embodiment of the invention shown in the drawings. Workers skilled in the art and technology to which this invention pertains will appreciate that alterations and changes in the described structures can be practiced without departing from the spirit, principles and scope of this invention.

Accordingly, the foregoing description should not be read as pertaining only to the precise structure described, but rather should be read consistent with, and as support for the following claims.

What is claimed is:

1. A furnace for reflowing solder on a microchip comprising:

a heating chamber having a top, bottom, side, and end walls formed of sheets of porous insulation, the heating chamber having an entrance and an exit;

a first belt, the first belt extending from a loading position into the heating chamber, and extending through the heating chamber;

a second belt coupled to the first belt, the second belt extending through the exit of the heating chamber to an unloading position;

wherein the heating chamber has infrared lamps positioned below the first belt; the infrared lamps heat the first belt, such that the first belt heats the microchip situated on the first belt.

2. The furnace of claim 1 further comprising:

a loading baffle coupled to the entrance of the heating chamber to prevent air from entering into the heating chamber;

an unloading baffle coupled to the exit of the heating chamber to prevent air from entering into the heating chamber;

wherein the first belt extends from the loading position through the loading baffle into the heating chamber, and the second belt extends through the exit of the heating chamber and the unloading baffle to the unloading position.

3. The furnace of claim 2 further comprising an exhaust chimney positioned between the loading baffle and the unloading baffle to remove waste materials from the heating chamber.

4. The furnace of claim 1 wherein the heating chamber is divided by the first belt into a first area and a second area, the first area is divided transversely to a direction in which the first belt travels to form a plurality of stages.

5. The furnace of claim 4 wherein each stage has at least one separately controllable infrared lamp.

6. The furnace of claim 5 further comprising a thermocouple situated above each stage and coupled to the first belt, each thermocouple measures the temperature of the first belt as the first belt passes; and a controller coupled to each thermocouple, the controller compares each measured temperature to prespecified temperatures.

7. The furnace of claim 6 wherein the thermocouple further comprises a first wire of a first material; a second wire of a second material; and a coupling of a third material, wherein the first and second materials have different electric potentials when heated, and the coupling transfers heat from the second belt to the first and second wires; wherein a temperature of the second belt is measured by measuring the difference in electronic potential between the first and second wires.

8. The furnace of claim 6 further comprising a computer program configured to select the prespecified temperatures.

9. The furnace of claim 6 wherein the first belt is heated to a maximum temperature in the last stage before the second end of the first belt.

10. The furnace of claim 9 wherein the first end of the second belt has a temperature lower than the second end of the first belt.

11. The furnace of claim 1 wherein the first belt comprises a dense stainless steel mesh that functions as a hot plate.

12. The furnace of claim 2 further comprising an airtight casing surrounding the heating chamber.

13. The furnace of claim 12 further comprising a cover gas directed into the airtight casing, the cover gas traveling through the insulation and into the heating chamber.

14. The furnace of claim 13 wherein the cover gas causes the inside of the heating chamber to have a higher gas pressure than outside the heating chamber.

15. The furnace of claim 14 further comprising a means for blowing cover gas down upon the first end of the second belt to cool a wafer on top of the second belt.

16. The furnace of claim 14 wherein the cover gas is nitrogen.

17. The furnace of claim 14 wherein the cover gas is hydrogen.

18. The furnace of claim 14 wherein the cover gas is clean dry air.

19. The furnace of claim 1 further comprising infrared lamps positioned above the first belt; the infrared lamps burn waste off of the first belt.

20. A furnace comprising:
a housing having walls defining a heating chamber disposed between an entrance and an exit, each wall including a porous insulative inner panel and a non-porous outer panel;
a first conveyor moving an object from a loading position through the entrance of the heating chamber, and through the heating chamber between the entrance and the exit;
a second conveyor moving the object from an end of the first conveyor through the exit to an unloading position; and
a pressurized gas inlet between the inner and outer panels to induce gas flow through the inner panel to the heating chamber;
wherein an area below the first conveyor is divided into stages transverse to the second conveyor; and
each stage has at least one infrared lamp to heat the first conveyor.

21. The furnace of claim 20 further comprising a first baffle unit having a chamber connecting the entrance of the heating chamber to an exterior of the furnace and a second baffle connecting the exit of the heating chamber to the exterior of the furnace; wherein the first conveyor passes through the first baffle and the second conveyor passes through the second baffle, and the first and second baffles have a means for injecting gas onto the respective first and second conveyors.

22. The furnace of claim 21 further comprising an exhaust chimney coupled to the heating chamber so as to remove waste products are removed from the heating chamber.

23. The furnace of claim 22 further comprising means for preselecting temperatures of the first conveyor in each stage of the heating chamber.

24. The furnace of claim 23 further comprising means for measuring temperatures of the second conveyor in each stage of the heating chamber.

25. The furnace of claim 24 further comprising a controlling means for changing the energy supplied to the one or more infrared lamps in a given stage depending upon a comparison of a preselected temperature and a measured temperature in a given stage.

26. The furnace of claim 25 wherein the means for measuring the temperatures of the first conveyor comprise a thermocouple having a first wire of one material, a second wire of a second material, the second wire coupled to the first wire through a coupling of a third material, the coupling being in contact with the second conveyor such that heat is conducted from the second conveyor through the coupling to both the first and second wires; and wherein the electrical potentials of the first and second wires are measured to determine the temperature of the second conveyor.

27. The furnace of claim 20 wherein the first conveyor comprises a dense stainless steel mesh that functions as a hot plate to heat an object.

28. A method for reflowing solder on a microchip comprising:
placing the microchip on a first conveyor extending from a loading position through a heating chamber;
heating the microchip to a solder reflow temperature;
transferring the microchip from the first conveyor to a second conveyor extending through a cooling area to an unloading position;
cooling the microchip; and
unloading the microchip from the second conveyor.

29. The method for reflowing solder on a microchip of claim 28 wherein heating the microchip to a solder reflow temperature further comprises passing the microchip through a plurality of stages inside of the heating chamber, the plurality of stages having different temperatures.

\* \* \* \* \*